United States Patent
Kash et al.

(10) Patent No.: US 6,327,394 B1
(45) Date of Patent: *Dec. 4, 2001

(54) APPARATUS AND METHOD FOR DERIVING TEMPORAL DELAYS IN INTEGRATED CIRCUITS

(75) Inventors: Jeffrey Alan Kash, Pleasantville; James Chen Hsiang Tsang, White Plains, both of NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/120,062

(22) Filed: Jul. 21, 1998

(51) Int. Cl.[7] .............................. G06K 9/36; G01R 27/28; G01R 25/00
(52) U.S. Cl. ........................... 382/280; 382/278; 324/617; 327/3
(58) Field of Search .................................... 382/278, 207, 382/208, 203, 218, 280; 372/25; 324/765, 617; 348/79; 327/2, 10, 90, 182, 231, 3, 244

(56) References Cited

U.S. PATENT DOCUMENTS

| | | | |
|---|---|---|---|
| 4,680,635 | 7/1987 | Khurana | 348/79 |
| 4,755,874 | 7/1988 | Esrig et al. | 348/126 |
| 4,811,090 | 3/1989 | Khurana | 348/79 |
| 5,006,717 | 4/1991 | Tsutsu et al. | 250/484.2 |
| 5,239,548 * | 8/1993 | Babbitt et al. | 372/26 |
| 5,343,404 * | 8/1994 | Girgis | 364/484 |
| 5,737,077 * | 4/1998 | Lee et al. | 356/317 |
| 5,784,285 * | 7/1998 | Tamaki et al. | 364/487 |
| 5,912,911 * | 6/1999 | Usami et al. | 372/25 |
| 5,923,190 * | 7/1999 | Yamaguchi | 327/12 |
| 5,940,545 * | 8/1999 | Kash et al. | 382/312 |
| 5,990,823 * | 11/1999 | Peele et al. | 342/90 |

OTHER PUBLICATIONS

U.S. Patent Appln. No. 08/683,837 filed Jul. 18, 1996 entitled "Noninvasive Optical Method for Measuring Internal Switching and Other Dynamic Parameters of CMOS Circuits".

IBM Invention Disclosure No. YO998–066 entitled "System and Method for Compressing and Analyzing Time–Resolved Optical Data Obtained from Operating Integrated Circuits".

* cited by examiner

*Primary Examiner*—Leo Boudreau
*Assistant Examiner*—Kanji Patel
(74) *Attorney, Agent, or Firm*—Fleit, Kain, Gibbons, Gutman & Bongini P.L.; Jon A. Gibbons; Casey P. August

(57) ABSTRACT

A method for processing time-resolved optical emission data ("waveforms") comprises processing both a first and a second waveform, and analyzing the results. The processing uses a substantial portion of the waveform and not merely the peaks of the waveform. A system which implements the method, and a computer readable medium which contains instructions for implementing the method, are also disclosed. The embodiments disclose methods for analyzing time-resolved optical emission data using correlation and/or transform techniques on the optical waveforms to extract timing information. The techniques offer more accurate results than direct examination of the waveforms and are additionally useful in tests having high noise or low numbers of detected photons. The techniques allow significant automation and the results lend themselves to graphic display.

19 Claims, 8 Drawing Sheets

COMPUTING DEVICE

TESTING DEVICE

COMPUTING DEVICE

APPARATUS AND METHOD FOR DERIVING TEMPORAL DELAYS IN INTEGRATED CIRCUITS

CROSS-REFERENCE TO RELATED APPLICATIONS

Not applicable.

BACKGROUND OF THE INVENTION

1. Field of the Invention

The invention disclosed broadly relates to optical tests for measuring switching activity in integrated circuits ("ICs"), and more particularly relates to analyzing data accumulated from such tests.

2. Description of the Related Art

Two disclosures, by the assignee of this application, deal with related technology. The first is U.S. patent application Ser. No. 08/683,837, which was filed on Jul. 18, 1996. That application discloses the use of optical techniques, such as gathering and analyzing photon emissions, for the testing of properly functioning ICs performing normal operations and not merely for testing defective ICs. Such a procedure is referred to as picosecond IC analysis ("PICA"). This first application will be referred to hereinafter as the "Base Application." The second disclosure is an IBM disclosure number YO9-98-066 and discloses advanced methods of storage and compression of PICA data. This second disclosure shall be referred to hereinafter as the "YO9-98-066 Disclosure." Both disclosures are included herein by reference, and are more fully explained below.

The Base Application

As part of the design and fabrication of a complex high-speed integrated circuit, it is often essential to observe the logic state switching of the individual devices comprising the circuit. Information on circuit timing is useful to diagnose problems relating to high frequency operation, propagation delays, and critical timing paths. A number of techniques have been developed to make dynamic circuit measurements, such as electron beam testing, electro-optic sampling, photoconductive sampling, and photoemissive sampling. Common to all these techniques is the requirement for providing an external probe (electron beam or laser) to perform the test. This requirement leads to the inability to determine timing at more than one device at a time, and loads the circuit, etc. For a variety of practical reasons, only electron beam testing has achieved widespread use in commercial chip development. Chief among these reasons is that the other techniques require special structures or materials on the chip which are incompatible with conventional silicon processing. Electron beam testing is limited by the need to access the relevant metal interconnect at the front surface by the electron beam. As logic circuits become more complex, with additional layers of metal interconnects and "flip-chip" bonding, the use of electron beam testing will become problematic.

A summary of the characteristics useful in a diagnostic tool includes: the ability to measure many devices on the chip simultaneously, no special conditions for chip preparation or design, a technique which is non-destructive and non-loading of the device, the ability to measure from the front side or the back side of the wafer, and the ability to measure internal switching speeds exceeding 10 GHz. Such a tool would provide information that would lead to both enhanced device performance and more rapid chip development, prototyping, and debugging. For example, if specific devices or subcircuits of a chip can be identified as limiting the overall speed of the complete circuit, then redesign of, or process modifications for, this portion of the chip can increase the yield of chips that operate at high clock speeds, increasing the performance and the economic value of the chips which are produced.

It has been known for several years that electronic devices, even majority carrier devices such as field effect transistors, including those fabricated from indirect bandgap materials such as silicon, can emit light when in saturation and current is passing through the device. There are a number of inventions, several of which are discussed below, relating to the use of these emissions to probe for failures or long-term degradation in individual devices.

U.S. Pat. No. 4,680,635 addresses the detection of light which is emitted continuously by a defective device on an integrated circuit as a means of failure analysis. This light is emitted as a result of avalanche breakdown, latch-up, current conduction through a damaged dielectric, or electrostatic discharge. Although that patent addresses enabling an image intensifier "for fixed periods of time to provide time resolution" of the images, the purpose of the time resolution is to help identify hot electron-induced long term degradation. In that patent, the term "time varying" refers to the decay or build-up of emissions due to the failure or degradation of a device, and not to the dynamic emissions from a normally-operating circuit which are synchronized with the logic switching of the circuit. The limited scope of that patent can be seen in the specific means chosen to obtain time resolution, that of electronically gating an intensifier. The time resolution obtainable by gating an intensifier is many orders of magnitude too slow for measuring the high speed (>1 GHz) switching of modem operating devices. Such a gating technique also makes such inefficient use of the available photons as to be very difficult to implement.

U.S. Pat. Nos. 4,755,874 and 4,811,090 provide improved means of image processing to aid in detecting the continuous faint emission discussed in U.S. Pat. No. 4,680,635. U.S. Pat. No. 5,006,717 describes a method to estimate the operating lifetime of an integrated circuit by measuring the spectral characteristics and supply voltage dependence of the optical emission associated with hot carriers.

Although each of the above patents considers using the optical emissions from silicon integrated circuits as a diagnostic for circuits, none of them address circuit timing analysis on a circuit with fully functional devices. Instead, those patents disclose the use of continuous or quasi-continuous optical emissions to evaluate circuits which are degrading due to hot carrier effects or which have already failed.

An advance was achieved with the disclosure of the Base Application which disclosed that normally-operating (i.e., filly functional) CMOS devices emit transient pulses of light coincident with logic state switching. Further, these transient pulses of light from normally functioning devices can be used to produce useable information about the timing of such devices.

In the Base Application, optical emission generated by the normal electrical switching of gates in a functioning integrated circuit is used to determine dynamic information about the internal time response of the circuit. By use of a suitable multichannel optical detector which is capable of time resolution of better than 100 psec, temporal information can be obtained from many devices on a chip simultaneously. This temporal information can include, for example, the sequential evolution of the logic state of each device on the circuit. The time resolution is suitable for determining possible timing problems in present and future integrated circuits with switching speeds up to at least 10 GHz.

The optical waveform of the emitted light is used to determine the temporal variation of the electrical voltages in the devices and circuits. Here, the term optical waveform, or time-resolved optical emission data, refers to the time dependence of the optical emission from an individual device which is undergoing periodic variation in its electrical waveform, such as logic state switching. In the common case of MOS circuits, light is emitted mainly when an individual device is in saturation. Light emission from a non-time-varying yet normally operating CMOS logic circuit, which draw very little average current, is essentially undetectable with present detectors. However, individual devices draw significant current and will very briefly be in saturation when the CMOS gate switches logic states.

It was discovered that optical emission from a normally operating CMOS circuit when undergoing switching is detectable by photon counting and other high sensitivity light detectors. Consistent with the above discussion, the emission is found to be a subnanosecond pulse coincident with switching. This pulsed emission can be a useful contactless probe of circuit timing for switching speeds up to and exceeding 10 GHz with presently available detectors. In addition, the emitted photon energy can be either above or below the energy gap of the semiconductor. Thus, the measurement may be performed from either the front side or the back side of the wafer. For detection from the front side of the wafer, any photons emitted by the elements of the integrated circuit can be detected. For detection from the back side of the wafer, only photons which are at a wavelength transparent to the substrate can be detected. Ideally, for backside detection, as presently realized, the backside of the wafer should be optically polished and the wafer should be as thin as practical while not altering the electrical characteristics of the circuit.

Two embodiments are described in the Base Application. The first is an embodiment where the optical waveform from only a single device of the integrated circuit is obtained at a time. The second embodiment is a multichannel means of detecting this emission with time resolution at each pixel, allowing the timing of many devices on the circuit simultaneously.

The Base Application enables measurements from fully-functional integrated circuits. Specifically, it obtains dynamic information (e.g., logic transitions, logic timing fails, and high frequency failures) on a fully-functional normal integrated circuit; obtains information on individual device parameters on a fully-functional normal integrated circuit; requires no special devices or structures to be manufactured on the integrated circuit solely for the purpose of the testing; is capable of testing from either the front side or the back side of the integrated circuit; requires no external probe such as a laser or an electron beam; and can be implemented either in a single channel version or in a multichannel version capable of monitoring numerous devices on the same chip simultaneously.

Further the disclosure of the Base Application utilizes the same clock as the usual chip clock, with no constraints on clock frequency; is capable of measuring switching speeds in excess of 10 GHz; is non-destructive and non-loading of the circuit under test; and can perform tests in air and does not require vacuum or unique environment.

The YO9-98-066 Disclosure

The raw data collected during a measurement of time-resolved optical emission from an operating integrated circuit consists of individually detected photons, where for each photon coordinates x,y, and t (i.e., two spatial coordinates x,y representing the location of the occurrence in the sample plane plus a time coordinate t representing the time at which the photon was emitted) are required to be stored. This data is collected by repeatedly applying the same test input under constant conditions to a circuit and monitoring the location and time of photon emissions resulting from switching events in the circuit. Repetition is required because in most cases, and particularly in the case of integrated circuits fabricated from silicon, an individual switching event will result in a detected photon with a probability of much less than 1, and typically on the order of $10^{-6}$. A photon emission will be considered to have occurred for a given x,y,t if at least one of the iterations of processing the input signal resulted in the detection of a photon for that x,y,t triple. Typically, x, y and t are each represented as an integer, where x and y might each range from 0 to 1023, representing points on a grid defining the area of interest, while t might range from 0 to 8191, representing gradations of time over some period of observation. In order to store this data in histogram form, the array must contain 8 billion elements, or 16 gigabytes of memory, allocating 2 bytes per array element. Because of this large storage requirement, storage of the data in this form is usually impractical.

An alternative storage approach, called "list" storage, stores the data more efficiently when the number of detected photons is much less than the number of array elements in the histogram. In list storage, the data is stored as a long list of (x,y,t) coordinates, where each (x,y,t) triple represents the coordinates for a single detected photon. Using the numbers given above, and assuming that there are, for example, 20 million detected photons, the list file would only be 120 million bytes long, much smaller than the 16 gigabyte histogram file. List and histogram modes both contain the same information, just stored in different ways.

The YO9-98-066 Disclosure teaches additional storage methods which reduce memory storage requirements. Because these methods use less memory and are more structured than list or histogram modes, they can also reduce the computational time for analysis of the data.

The methods fall into two general classes: those which compress the data without any loss of the original data ("lossless compression") and those for which the original data cannot be fully reconstructed ("loss compression"). In a preferred embodiment of the invention, a combination of these methods will produce optimal results. It should be noted that information describing the order of the iterations of the application of a given input which resulted in a photon emission for a given x,y,t triple is usually not useful in the testing of integrated circuits. Therefore, a compression method which loses track of this order will be considered lossless. If this were not true, then histogram and list storage modes discussed above would not be equivalent, because the histogram storage mode does not preserve any of the order information for a given (x,y,t) triple.

In a first embodiment of the YO9-98-066 Disclosure, with reference to the flow diagram of FIG. 1, a lossless reduction of the memory required to store the data generated from time-resolved optical emissions can be obtained in a modified histogram mode by accumulating data 104 representing coordinates x,y,t and the number, n, of photons at x,y,t —storing only values of n(x,y,t) which are non-zero 108. This method of storage can be significantly more efficient than either conventional histogram or list modes. This is particularly true when, as is typical for data on optical emission from operating CMOS circuits, the emission comes out only during limited periods of time and from limited areas of the chip, i.e., many photons will have the same (x,y,t) coordinates, while many other (x,y,t) coordinates will have no photons at all.

One algorithm for compressing data into this form from list mode 102 is to first sort the list data so that all photons from all iterations with the same (x,y,t) coordinates are grouped together, which provides an easy means to count the number n 106. If n>0, the result is stored as the number n of photons which have this value (x,y,t).

Further lossless compression of data stored in this modified histogram mode can be achieved by any compression scheme which does not lose data, such as any scheme which is used for disk compression on a PC today.

The above storage schemes have the advantage of keeping every piece of information in the raw data, without any loss of information. In accordance with a fuirther embodiment of the invention, data is further compressed by making certain assumptions about the data and using those assumptions to further compress the data, but allowing some information which is not significant to be lost.

One such approach in accordance with the invention is to recognize that any real optical detector has noise which, in the case of a photon-counting detector, is in the form of "dark counts", i.e., "false positives". In addition to dark counts, stray light can produce unwanted signal photons. These sources of noise taken together constitute the "background". The background contains no useful information, and a compression technique in accordance with the invention distinguishes between useful signal and background to allow elimination of the background from storage, further compressing the data.

If it is known that in a given data integration time, T, each array element (x,y,t) will accumulate $n_{background}$ background counts on average, then any value n less than some value $n_{threshold}$ can be considered as 0, and dropped accordingly, while values of n greater than $n_{threshold}$ are reduced by $n_{threshold}$. Typically, $n_{threshold}$ should will be approximately equal to $n_{background}$. This reduces considerably the storage required in any of the histogram modes above.

More sophisticated noise-reduction algorithms, such as spectral analysis techniques (e.g., Fourier filtering), could also be applied, which can, for example, determine if all the points in some region of x,y,t space contain only background counts. This determination is possible because the dark count is generated by a random process. Hence, the time-series representation of the dark count constitutes white noise which is easily recognized by autocorrelation. A lag value may be determined by knowing the approximate shortest period of a desired histogram element. That is, if it is known that a switching event should not result in a duration of an optical emission pulse shorter than some minimum, then pulses of width less than this minimum can safely be assumed to be dark counts.

The previous paragraph describes Fourier filtering as applied in the time domain.

The same approach can be applied to the spatial coordinates when the features of interest are known to occupy more than a single spatial pixel x,y.

Such more sophisticated threshold schemes are useful if the signal is weak so that a typical number of useful signal photons in an array element (x,y,t) was only a little larger than $n_{background}$. All such schemes can be categorized by the term data compression by elimination of background counts.

An algorithm for compressing data into this form is similar to the algorithm above for lossless compression, except that, after n is determined, only those values of n>$n_{threshold}$ are stored.

In accordance with another embodiment of the YO9-98-066 Disclosure, as shown in FIG. 2, a given field effect transistor channel (or other circuit element of interest) or group of related channels, which in general occupy more than a single image pixel x,y, can be assigned to a group of pixels 202. If the x,y,t data for all pixels in the group associated with the given circuit element is stored, much of the information will be redundant. Therefore, rather than storing all such x,y,t data, optical emission photons for the circuit element as a whole can be stored in the list form w,t, where w identifies the particular circuit element or group of elements or other structural feature of the device under test 204. The data can also be stored in histogram form for the particular circuit element as n(w,t), where n is the number of photons stored in the list with coordinates w,t 204. The histogram n(w,t) for a particular circuit element w is the "optical waveform" for the circuit element w.

The means for selecting the group of pixels to be associated with the circuit element of interest can include, for instance, first performing a computerized image analysis of the time-integrated image or various time-resolved images to locate the emission sources on the chip and determining the pixel elements that line up physically with those regions of the chip. A second technique incudes first consulting the design data describing the integrated circuit under test (schematic and/or layout data), and aligning elements of the layout with the field of view of the imaging apparatus. Still another technique is to first obtain an image of the chip using external illumination and aligning features on the chip with the field of view of the imaging apparatus.

In accordance with this embodiment, the optical data is stored as a series of optical waveforms, one waveform for each device of interest in the field of view of the optical detector 206. Thus data compression can be achieved because the number of optical waveforms to be stored for a particular field of view can be much less than the number of x,y pixels within the field of view. Compression also results because many x,y pixels correspond to no device of interest, and so data from such x,y pixels need not be stored.

This approach of storing the optical waveform for each device (rather than for each pixel associated with a device) within the optical field of view can also be applied while the data is being acquired, so as to minimize storage requirements of an initial data file. That is, the selection of the appropriate pixels to be associated with a particular device can be performed "on the fly" either manually by the user, or automatically by the system. Significantly, using this technique during data acquisition will provide a real-time readout of the optical waveforms to the user. If the pixels belonging to each device can be determined prior to acquisition of the emission data (from, for example, design data or an image taken with external illumination), then application of this technique is direct. If the pixels belonging to each device cannot be determined prior to acquisition of the emission data, then the determination can be done part way through the data acquisition. The data accumulated during this determination phase is then compressed to a series of optical waveforms, with the subsequent data added to these existing waveforms to improve their signal-to-noise ratios.

One of the methods of data presentation discussed in the Base Application is to display the optical data in the form of a "movie", i.e., a sequential series of time-resolved images (of the IC or a portion thereof). Such a movie can also be generated after compressing the data by storage of optical waveforms. Specifically, from the time-integrated image or various time-resolved images, the spatial intensity pattern of each device can be determined. The optical waveform of that device can then be used to appropriately scale this spatial intensity pattern for each frame of the movie.

Finally, it may be possible to store the optical waveform data in a more compact form than intensity vs. time. Since the waveform data is usually a series of pulses separated by longer stretches where there is no optical emission, one could store just those time values with non-zero emission for that device. In addition, shot noise from the photon counting statistics could be filtered out by any standard filtering technique. If certain devices have a standard temporal shape to each pulse, then further compression can be obtained by storing the time position and amplitude for each observed pulse. Fourier, Laplace, or wavelet transform techniques can be used to filter and store the meaningful information contained in each optical waveform. Filtered data can be stored in either the time domain or the frequency domain.

Further Related Art

As previously described, time dependent optical emission is produced by CMOS gates when switching. This emission can be used to quantitatively describe the electrical switching with picosecond temporal resolution using detectors available today. The raw data collected during a measurement of time-resolved optical emission from an operating integrated circuit consists of individually detected photons. The coordinates x,y, and t of each of these photons (i.e., two spatial coordinates x,y representing the location of detected occurrence in the sample plane plus a time coordinate t representing the time at which the photon was emitted) are stored during the measurement. Data with statistically significant signal to noise are collected by repeatedly applying the same test input under constant conditions to a circuit and monitoring the location and time of light emission resulting from switching events in the circuit. Repetition is required because in most cases, and particularly in the case of CMOS integrated circuits fabricated on silicon, an individual switching event will result in a detected photon with a probability of much less than 1, typically on the order of $10^{-6}$.

Because of this low probability, a substantial amount of time involving the execution of many test cycles is usually needed to accumulate enough data for accurate analysis, even for circuits running at speeds above 100 MHz. Furthermore, in those situations where there are only a small number of detected photons, it is difficult, with the signal processing methods, heretofore disclosed, for optical waveforms, to obtain accurate and meaningful results. This also limits the quality of the results that can be achieved for a given data set.

As mentioned earlier, there is noise present during the tests and during the accumulation of detected photons. This noise is generally broken down into two different components—dark noise and Poisson noise. Dark noise is the electrical noise associated with any real detector that cause false counts to occur. Dark noise is white and spurious, and varies from detector to detector. Poisson noise refers to the statistical noise due to Poisson characteristics. Poisson noise results from the process of counting photons, the arrival of which is a random process, for a fixed period of time. With a limited observation time, the true long term average can only be approximated, and the error bar is the square root of the number of photons counted. As can be seen, as the observation time increases and, presumably, the number of photons counted increases, the error bar decreases as a percentage of the number of photons counted. For example, with 100 counts, the error bar is 10 or 10%, however with 1 million counts, the error bar is 1000 or 0.1%. In the existing prior art implementations, the Poisson noise is almost always more significant than the dark noise.

The presence of noise, both dark and Poisson, argues for collecting large amounts of data so that the data can be meaningfully analyzed. As stated above, however, this requires a lot of test time.

Another byproduct of collecting a large amount of data is that displaying the data is computationally complex. There can be thousands of parallel data streams that are collected and that need to be displayed. Additionally, there are only rudimentary methods for displaying this data, such as waveforms or movies. These current methods do not lend themselves to producing results which are easily and quickly displayed and comprehended by the user.

Accordingly, there is a need for a method of analyzing and displaying the data from IC tests which overcomes these problems, and for a system and medium which implement the method.

SUMMARY OF THE INVENTION

Briefly, in accordance with one aspect of the invention, a method for determining timing data between at least a first location and a second location on an integrated circuit ("IC") comprises three steps. The method uses at least a first waveform and a second waveform. The first waveform and the second waveform comprise time-resolved optical emission data obtained from either the first location or the second location, respectively. The first step is processing a first sampled waveform, which comprises a substantial portion of the first waveform. The second step is processing a second sampled waveform, which comprises a substantial portion of the second waveform. The third step is analyzing the results of the two processing steps.

Briefly, in accordance with another aspect of the invention, another method for determining timing data between at least a first location and a second location on an IC comprises two steps. The method uses at least a first waveform, wherein the first waveform comprises time-resolved optical emission data. The first step is processing a first sampled waveform, which comprises a substantial portion of the first waveform. The second step is analyzing the results of the processing step.

Briefly, in accordance with other aspects of the invention, there are disclosed systems which implement the above methods.

Briefly, in accordance with other aspects of the invention, there are disclosed computer readable media containing instructions for implementing the above methods.

DETAILED DESCRIPTION OF AN EMBODIMENT

General

Figure 1:
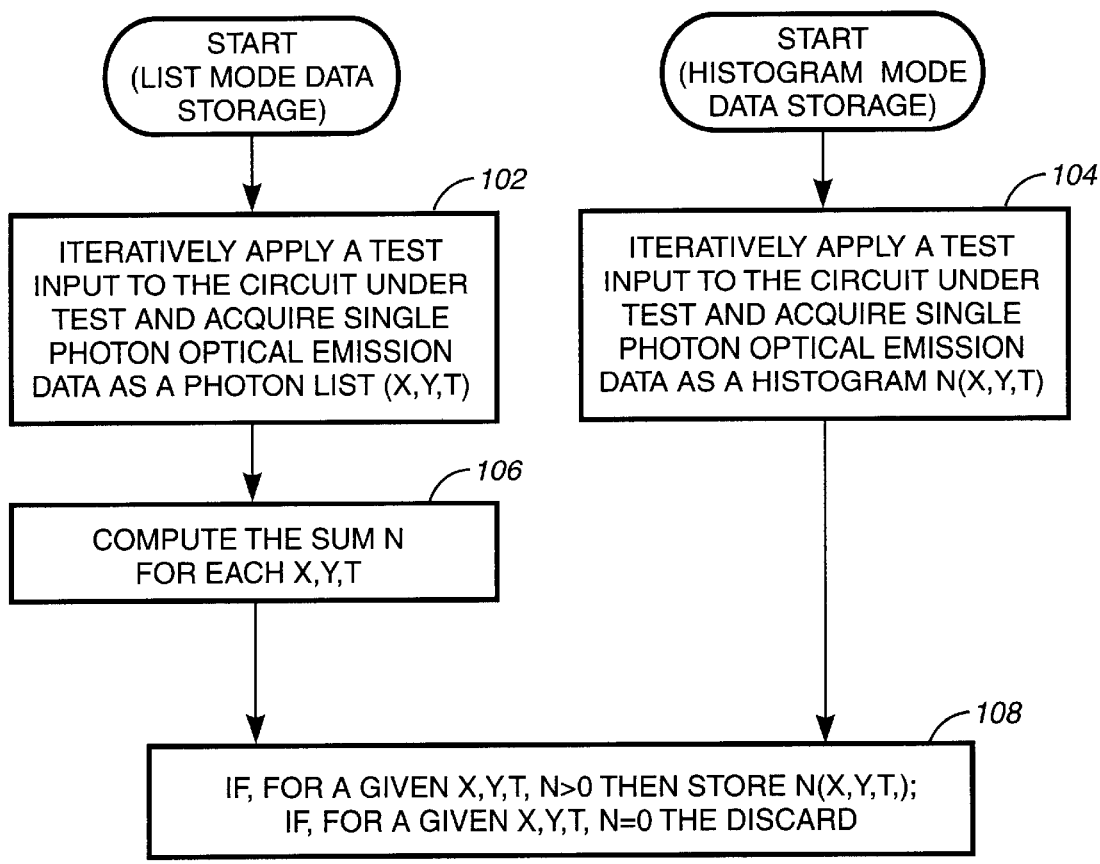
FIG. 1 shows a flow diagram for non-zero histogram storage according to the prior art.
Figure 2:
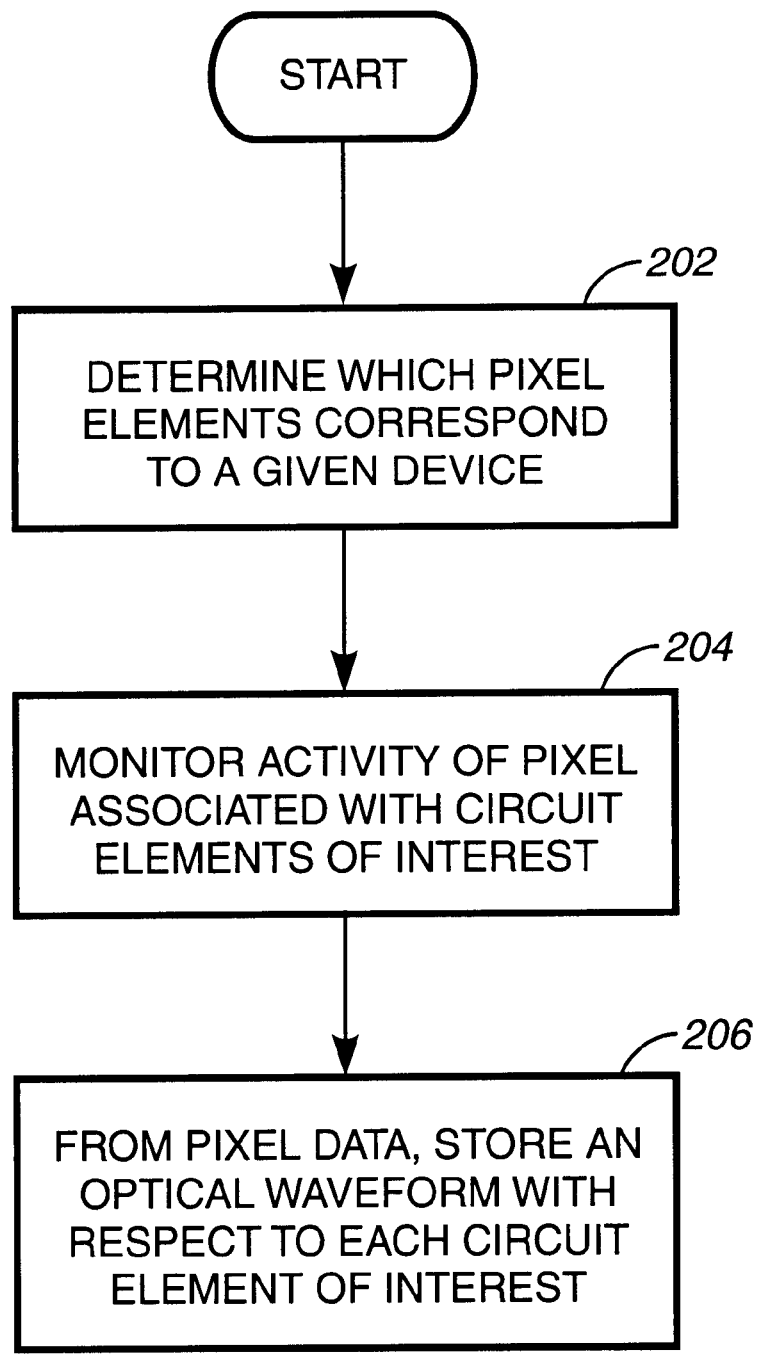
FIG. 2 shows a flow diagram for generating an optical waveform for a device, according to the prior art.

Disclosed herein are methods of signal processing which permit accurate and meaningful results to be obtained from a minimum number of photons, and which thereby decrease the amount of time needed to acquire accurate timing information. Also, for a given data set, such methods allow us to obtain the most accurate timing information possible. An important timing parameter, which describes the switching activity of gates in an integrated circuit, is the frequency at which they switch and the relative phases or delays of the switching transitions. Other parameters describing the experimental data such as the temporal widths of the light pulses may be of less significance, and are not considered in great detail here.

This disclosure teaches additional methods for analysis of time-resolved optical emission data beyond those previously disclosed. In the previous disclosures, analysis of the data as either a series of individual time frames (possibly assembled into a movie), or as a set of "optical waveforms" (number of photons vs. time from one or a group of pixels) was disclosed. The embodiments of the new methods taught here utilize correlation and/or transform techniques on these optical waveforms to extract high resolution quantitative timing information. Because these techniques obtain timing information by computations which utilize the entire waveform, they can provide more accurate results with regard to circuit timing than direct inspection of the individual peaks of the optical waveforms. While it is standard and useful to utilize the entire waveform for the computations, this is not necessary, particularly for large data sets. It may generally be said that a substantial portion of the waveform should be used. This is meant to convey the fact that this technique does not rely on visual inspection of the waveform to identify the peaks and then operate only on those peaks. The exact portion of a waveform that is necessary to generate accurate results, however, will depend on many factors. Such factors include but are not limited to the frequencies present in the data, the periodicity of the data, the type of noise, and the noise level. The portion of a waveform that is used in the preferred embodiments is a contiguous portion. However, that may not always be necessary and non-contiguous portions may be used. In any event, the portion, or portions, of the waveform that is used can be referred to as the sampled waveform.

The improvement in accuracy from these techniques is especially important in the case where the number of detected photons is small. In such a case, the Poisson statistical noise may be large. By using a substantial portion of the waveform in the analysis, the photon counts associated with any given switching event are aggregated and the Poisson noise (or error bar) is reduced. The benefit of this aggregation relies in part on the fact that a given switching event will not typically occur in a single instant of measured discrete time. The techniques disclosed thus allow better results to be obtained for a given amount of data, or allow equivalent results to be obtained with less data and therefore in less time.

These techniques allow significant automation in the data analysis process which is critical since tens of thousands of distinct optical waveforms can be present in a single data set. Without such automation, the analysis of the data can become impractically long. Finally, and just as importantly, because of the large amount of information, there are also disclosed novel ways of displaying the obtained information quickly in ways which permit a user to easily comprehend the meaning of the large volume of data.

The inventors have determined, through a series of tests, that the methods described in this application, according to the present invention, have superior results over the previous methods of analyzing the detected photon emissions. Given the amount of noise (particularly Poisson) present in the test data, and the lack of symmetry between the waveforms from different points in the IC, it was not at all obvious that such methods of analysis should be utilized. However, as described below, these methods proved useful even on waveforms that were only partially repetitive (that is, had only a partial similarity) and on waveforms with a low signal-to-noise ratio (that is, significant levels of noise compared to the number of detected photons).

As should be clear, the techniques disclosed can be performed independently of the gathering of the data. That is, the data for the waveforms can be collected in tests and then formed into waveforms independently of using any of the processing and displaying techniques disclosed herein. This allows the devices to be tested separately, in time and in location, from the processing and displaying of the test information. These techniques, however, could also be performed in concert with the collection of test data and/or its formation into waveforms.

Detailed Description of a First Preferred Embodiment of the Invention

The first embodiment of this invention relates to the derivation of quantitative data on circuit delays from time resolved images of switching induced emission in complementary metal oxide semiconductor ("CMOS") circuits. It is directly applicable to cases where a physical signal is propagated through the device-under-test ("DUT") and where it is necessary to measure the delays associated with the gate to gate propagation of the signal. Simple examples of this include the propagation of clock signals across a chip, and the propagation of signals through the latches of a scan chain or a ring oscillator.

Figure 3:
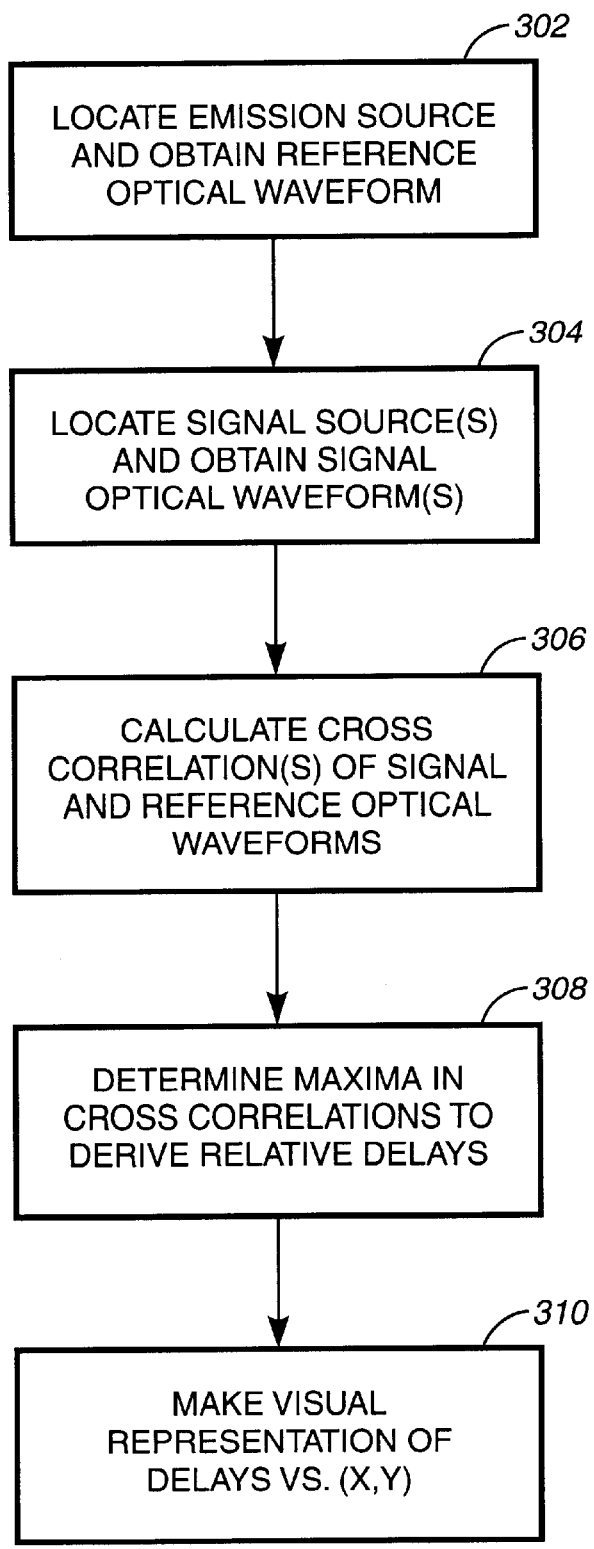
FIG. 3 shows a flow diagram for the first preferred embodiment of the present invention.

In a first embodiment of the invention, with reference to the flow diagram of FIG. 3, a single optical waveform is generated 302 from a time-resolved optical emission file consisting of many individual waveforms. The (x,y) pixels used to generate this particular waveform can be determined in a manual fashion, or, alternately, by a computer algorithm. There are a variety of computer techniques that can select the appropriate (x,y) pixels, including but not limited to, a touch screen that allows the user to point to a particular gate, or a computer-automated design ("CAD") system that allows the user to type in a gate identifier. Call this waveform the reference waveform r(t). Here t is the time, which takes only discrete values $t_0, t_1, t_2, \ldots, t_n$ because the data is stored digitally. While, theoretically, any waveform in the emission file can be used as r(t), from a practical standpoint it is essential that r(t) represent a temporal pattern which is significant in the functioning of the circuit. Furthermore, it is preferable that r(t) be relatively intense.

A second optical waveform, here called the comparison waveform c(t), can be generated 304 from any of the other optical emission spots in the time resolved emission file which, by circuit functions, should show the same temporal pattern as r(t), although delayed. This can be achieved if the structure of the signal is either unchanged by the DUT or if it is restored to its original state after a certain number of operations, such as when a signal propagates through two inverters in series. Since the comparison waveform has the same shape as the reference waveform except for a delay in time, the cross-correlation 306

$$C(k) = \sum_{i=k}^{n} c(t_i) r(t_i - t_k)$$

will be maximum 308 at the value of k corresponding to the delay between the two waveforms. If peaks in c(t) and r(t) do not have the same shape, the maximum in the cross-correlation C(k) is still related to the delay between c(t) and r(t), with an additional factor describing the difference in the waveforms.

In the case where an optical waveform has multiple peaks, it should be noted that meaningful information can sometimes be obtained by using that waveform for both the reference and the comparison. In this case the cross-correlation becomes an auto-correlation. As a first example, consider an AND gate with multiple inputs. By performing an auto-correlation on the output, one can determine information on possible race conditions, etc. at the inputs, albeit not necessarily complete information. An auto-correlation can also provide information on the timing between two gates which are too close together for the photon detector to spatially resolve photon emissions from each of them separately. Because the gates are so close to each other, the photon emission information will be stored in the same waveform, and an auto-correlation of this combined waveform will provide information on the timing between the two. An auto-correlation can also provide timing information for a single gate. This technique can be used, for example, to determine the cycle time of a clock, or the length of a one-shot pulse.

Note that the maximum in C(k) is the same as the minimum in the best fit function $$\sum_{i=k}^{n} (c(t_i) - r(t_i - t_k))^2.$$

Therefore, maximizing the cross-correlation function is mathematically equivalent to minimizing this second, or best fit, function.

The maximum in C(k) thus determines the delay $\tau = t_k$ in r(t) required to produce the best fit to c(t). We use the cross-correlation because it is computationally easier to calculate. Also note that the cross-correlation C(k) can be directly computed from the definition above, or, in a more computationally efficient manner such as from the Fourier transform of the product of the individual Fourier transforms of c(t) and r(t).

The cross-correlation is a good method for determining relative circuit delays for several reasons. First, the calculation can use all the available data, as opposed to, for example, just locating the maximum in an optical waveform, and so gives accurate results even when the optical waveform is noisy. Second, finding the maximum in the cross-correlation is a well-defined algorithm which can readily be automated and performed by computer without human intervention. Third, this algorithm is not computationally intense, so it can be calculated quickly by computer. Finally, because it is readily automated and can be calculated quickly, it is possible to process and compare an entire PICA data set, either by single pixels or single devices, to the reference waveform and obtain the relative timing of every element of an entire circuit relative to the reference waveform, without manual intervention.

When an entire PICA data set has been processed in this way, display of the data in a simple, single format will be extremely useful. Switching events can occur within a single clock cycle, or be synchronized by successive clock cycles. PICA observes the activity in the chip over a particular duration of time defined by the test cycle. The initiation of the activity in the chip, and the completion of the test sequence occur at well defined times. The peaks generated by the cross-correlations of a reference clock waveform with the waveforms generated by the other gates and logical functions produce a series of switching times $\tau$. These times describe the sequential operation of the circuit within the test cycle. The representation 310 of these times within the physical two dimensional layout of the circuit then shows the propagation of the circuit activity during the test cycle.

Any of the standard means for representing a function $\tau(x,y)$, where $\tau$ is the magnitude of the delay at the gate located at (x,y) can be used. These include, but are not limited to, schemes such as color coding the delay times, making a contour plot of the delay times, or making a surface plot of the delay data. The (x,y) representation can be of real space or of some equivalent type of space, and these options include, but are not limited to, a physical, schematic, logical, or other representation of the chip. The representations can take virtually any form and are largely dependent on the system on which they are being displayed. Further, the delay information may be displayed in other useful forms aside from or in addition to delay times, including but not limited to phase shifts or numbers (including fractions) of clock cycles. Another type of representation, which is not an (x,y) representation but which is useful in many applications, for example in critical path analysis, is a histogram of delay times.

Detailed Description of a Second Preferred Embodiment of the Invention

Figure 4:
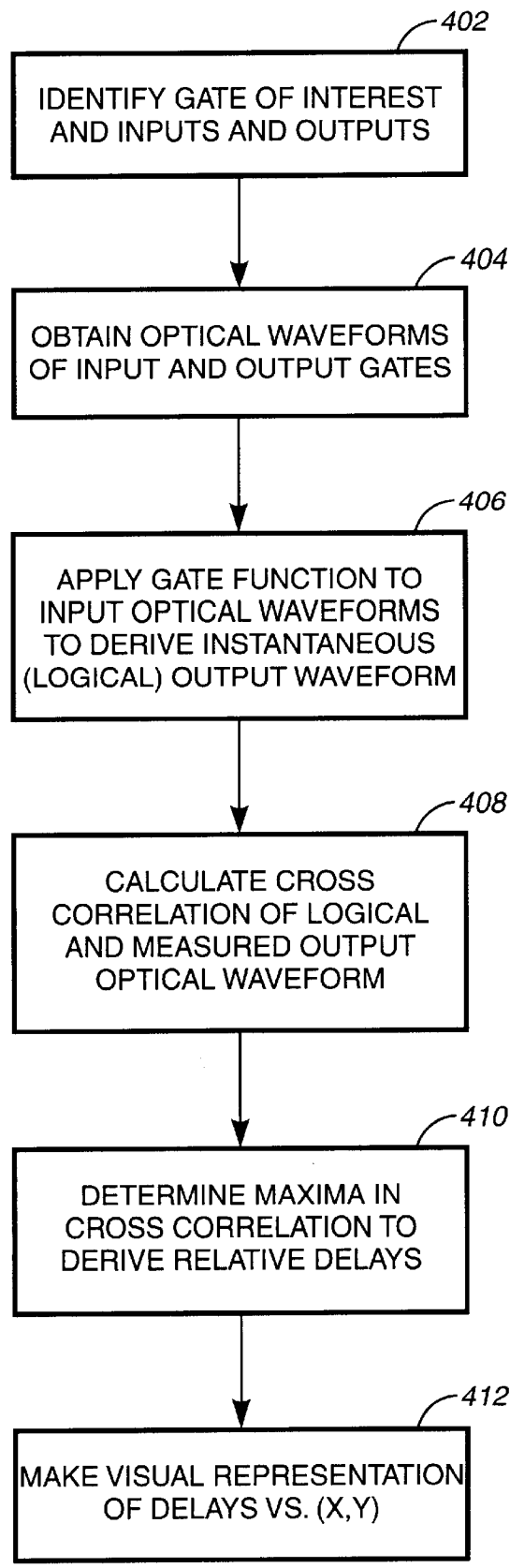
FIG. 4 shows a flow diagram for the second preferred embodiment of the present invention.

In most cases, the individual gates of the DUT act on the signals propagating through the DUT. For example, passing a signal through an inverter reverses the phase of the signal. A NAND gate passes only particular parts of a single input signal to the next stage of the circuit, depending on the states of the other inputs. This is in contrast to the first embodiment where a signal is simply propagated through the DUT and the internal structure of the signal is either unchanged by the DUT or restored to its original state after a certain number of operations. An example of the latter is the output which emerges as an input is processed by two inverters in series. In a second embodiment of the invention, with reference to the flow diagram of FIG. 4, we consider systems where the temporal structure of the signal is altered by a circuit of the DUT.

We begin with a single optical waveform generated from the time-resolved optical emission measurement. The (x,y)

pixels used to generate this waveform are determined 402 from a specific interest in the behavior of one of the gates being driven either directly, or indirectly, by the devices producing this waveform. Call this waveform the input waveform i(t). Here again t is the time, which takes only discrete values $t_0, t_1, t_2, \ldots, t_n$ because the data is stored digitally.

We also then identify the other circuits which drive the gate of ultimate interest 402. For each of these circuits, we identify their spatial coordinates, and generate the optical waveforms associated with these spatial coordinates 404. Each of these waveforms need not be measured, but may alternatively be simulated. We mathematically combine the input optical waveforms to generate the logical output, L(t), of the functional gate being driven by these input waveforms 406.

This generation of L(t) can be achieved, for instance, by associating a certain intensity of detected photons with a change in binary state of one of the inputs. Assuming that the initial conditions of all of the inputs are known or can be fixed, then the subsequent binary states of these inputs can be ascertained by deciding whether the photon intensities indicate a state change. Alternatively, in certain applications the binary input can be simulated. The logical operation of the gate or circuit under examination is then applied to the derived binary inputs, and a binary output is formed. Assuming that the initial condition of the output is known, it is straightforward to determine for which transition points of the input the output should also change. The last step is to associate the required intensity of photon detections with the determined output transition points in order to generate the output waveform L(t).

In mathematically combining our input waveforms, we generate an output waveform with no temporal delay. The mathematically generated logical output waveform, L(t), is then cross-correlated with the physically measured output optical waveform, O(t), to obtain the delay of the gate 408, 410. Since the logical operation of a gate is determined by its physical structure, the delays associated with the different logical operations in the circuit can be plotted in the same way as the delays obtained in the first embodiment to provide a clear visual representation of the sequential delays in the operation of the DUT for a given test process 412.

Detailed Description of a Third Preferred Embodiment of the Invention

In the first two embodiments, we have focussed on obtaining the maximum possible information from the experimentally obtained data sets. This has required a complete independent understanding of the behavior of signals in the DUT. It is possible to take any two optical waveforms and calculate the cross-correlation function between them. For example, it is often desirable to determine the timing relationship between two devices or gates for which the waveforms are only partially repetitive, or for which much of the waveforms are buried in noise.

The cross-correlation function will always show structure which is related to the operation of the DUT. Temporally, the structure will typically take two forms. One set of structures will typically derive from the operation of the clock system driving the test sequence. The cross-correlation function will then show the periodicity of the DUT clock. Identification of these structures provides a complete statistical description of the performance of the clock system of the DUT. A second set of structures will typically occur on a time scale short compared to the periodicity of the DUT clock. These provide information about specific internal processes such as: the skew rate of individual gates (from comparisons of NFET and nFET emissions), gate to gate delays in a latch, other simple finctions (although with reduced signal to noise as compared to the results obtained in either the first or second embodiments), etc. In all cases, analysis of the structure in the cross-correlation finctions derived from the optical waveforms throughout the DUT provides a complete statistical picture of the dynamic response of the DUT.

Figure 5:
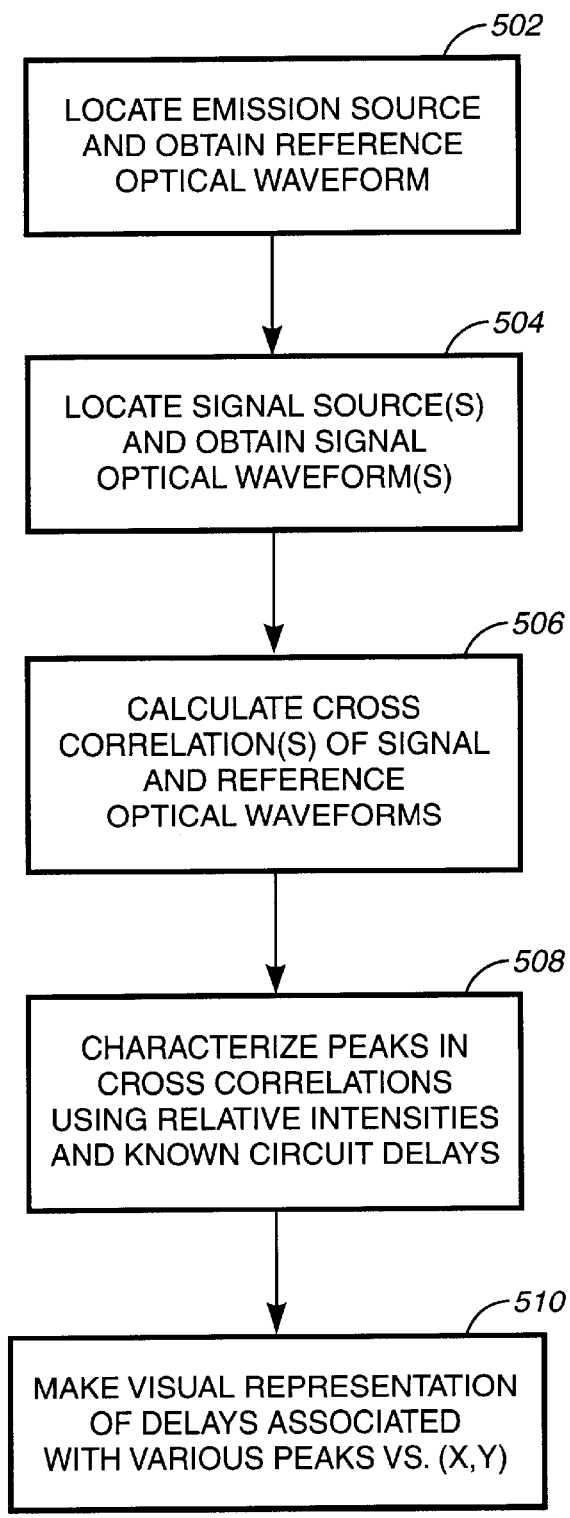
FIG. 5 shows a flow diagram for the third preferred embodiment of the present invention.

The process is similar to that in FIG. 3. Referring to FIG. 5, the first device, gate, (x,y) coordinate, etc. is selected and the optical waveform is obtained 502. Likewise, the second device and its waveform are obtained 504. The cross-correlation function can then be calculated 506, and the peaks determined 508. Any information that is already known about the IC can be used to help determine what the various peaks signify 508. Once the information, or structure, is determined, it can be displayed using any of the myriad techniques already mentioned with respect to other preferred embodiments 510.

Detailed Description of a Fourth Preferred Embodiment of the Invention

The physical variables of primary interest in the time resolved optical waveforms are the numbers of switching events at each gate and when each switching event occurs. Actual tests of chip performance involve multiple clock cycles of the DUT. Over the period of the test, the time resolved optical emission data set will include optical waveforms from various devices with different numbers of pulses. There will be areas of the DUT that will show a pulse every external clock cycle. If the DUT includes a clock multiplication circuit, there will be areas that show multiple pulses during each external clock cycle. At the other limit, there will be areas of the chip which show no activity, or only a single emission pulse over the duration of the electrical test. The description of the number of pulses that occur for a particular gate in a test cycle, and their relative phases can be directly obtained from the emission data set through the temporal Fourier transform of the dataset for each experimentally significant value of the spatial coordinates. A waveform that has the frequency of the external clock, or the phase-locked loop of the DUT will be identified easily from the presence or absence of significant amplitude at the relevant frequency f in the Fourier transform. The Fourier transform also associates a phase $\phi(f)$ with each frequency. Although a Fourier transform is described in this embodiment, any other suitable transform, including but not limited to wavelet transforms, Laplace transforms, and z-transforms, could be used.

Figure 6:
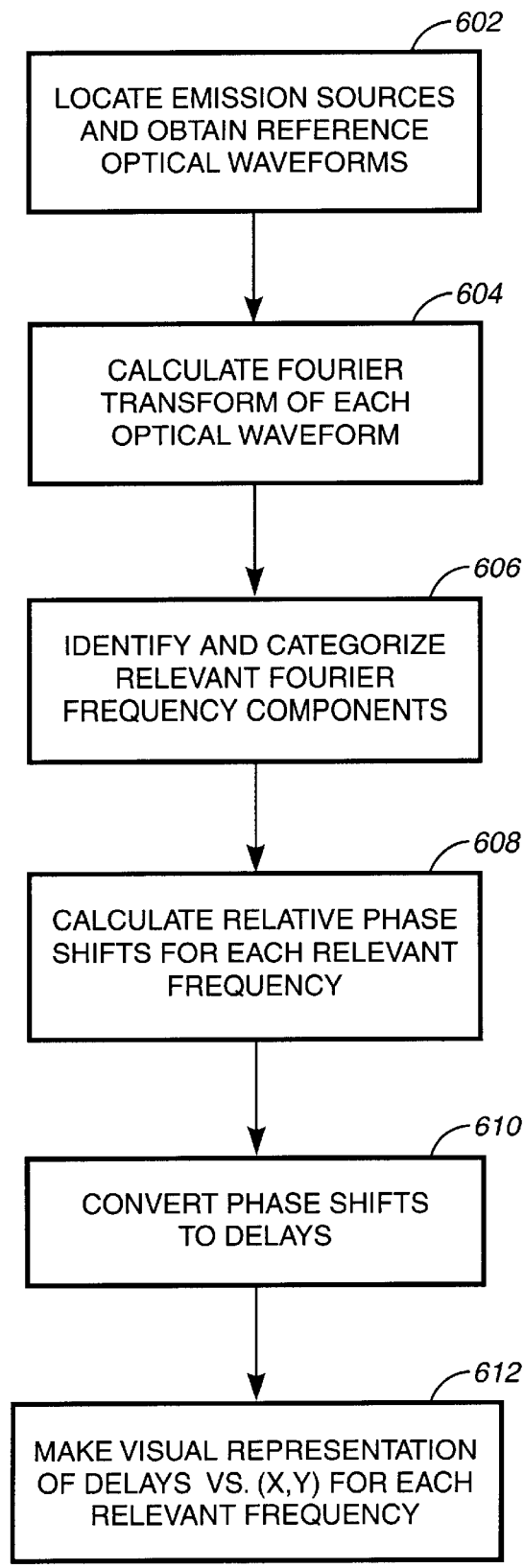
FIG. 6 shows a flow diagram for the fourth preferred embodiment of the present invention.

Referring to FIG. 6, waveforms are obtained for two emission sources A and B 602, each with significant amplitude at frequency f. The Fourier transforms are calculated for each waveform 604, and the frequency components at frequency f are identified 606. The relative phase $\Delta\phi=\phi_B(f)-\phi_A(f)$ of the transforms can be calculated 608, and it provides direct information about the delay between A and B. The phase shift is converted to a delay time by the relationship $\tau=\Delta\phi/(2\pi f)$ for phase angles expressed in radians 610. The delays can then, as with the other embodiments, be represented visually 612.

The use of transforms for such a purpose goes beyond the prior art's suggestion that noise could be filtered, or the suggestion that transforms could be used to filter and store meaningful information about a particular, single waveform. The prior art was concerned with compression and storage of individual waveform data. The present embodiments, however, are concerned with analyzing the information contained in the waveforms, ascertaining the relative timing between two different waveforms, and quickly displaying this timing information in a meaningful manner. As stated earlier, the data did not suggest the use of either correlations or transforms in analyzing the timing. This is explained, in large part, by the facts that the waveforms are often only partially repetitive and buried in noise. This situation is further demonstrated by the length of time that passed before these new analysis techniques, which use a substantial portion of the waveforms instead of an isolated location, were developed and, later yet, shown to be more accurate than the existing techniques.

If waveform A is a reference waveform r(t) as defined in the first embodiment of the invention, then for each relevant frequency f, the relative delay $\tau_f$ can be determined at each position x,y in the dataset. Then any of the standard means for representing a function $\tau(x,y)$, where $\tau$ is the magnitude of the delay at the gate located at (x,y) can be used to display the data in a meaningful way, as explained in the discussion of earlier embodiments.

Detailed Description of a Fifth Preferred Embodiment of the Invention

Sometimes, due to limited spatial resolution, a single pixel or location (x,y) in an optical emission dataset will include emission from more than a single device. In such a case, multiple frequency components may be present in the Fourier transform of the optical waveform from that pixel. These different frequency components may arise from the different devices within that pixel. An example could be a dataset where an entire scan latch occupies a single pixel, so that frequency components at both the scan clock frequency $f_1$ and the scan data frequency $f_2$ would be present. The scan clock delay at the latch could be determined as in embodiment four as $\phi(f_1)/2\pi f_1$.

Figure 7:
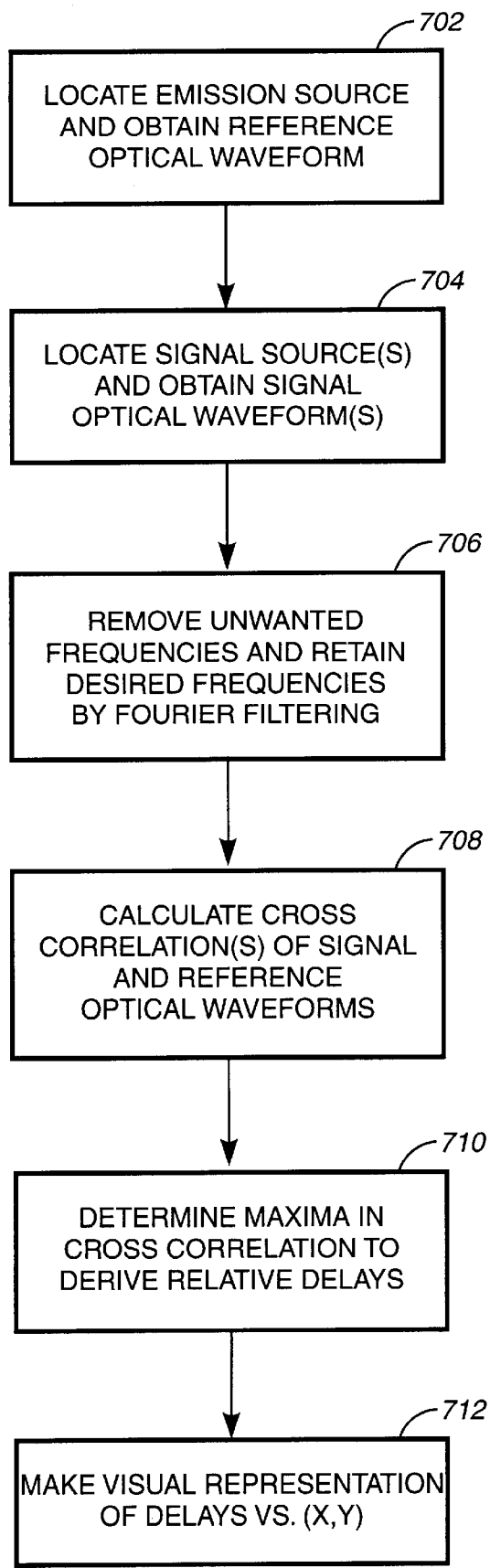
FIG. 7 shows a flow diagram for the fifth preferred embodiment of the present invention.

An alternate approach would be to use Fourier filtering to remove the scan data from the optical waveform. Referring to FIG. 7, the waveforms for both the scan clock and the scan latch would be obtained 702, 704. Fourier filtering would then be used to remove the scan data from the scan latch's waveform 706. Then the techniques of the first embodiment could be employed to calculate 708, 710 and display 712 the circuit delays just for the scan clocks. This method can be generalized to include any desired frequency components and exclude any undesired frequency components in the Fourier-filtered optical waveform. It can also be used on waveforms obtained for entire devices, which may occupy more than a single pixel.

This type of data could also be analyzed directly with the correlation techniques of the first or third preferred embodiments. The cross-correlations would produce multiple local maxima, each of which would contain information on delay times associated with different signals. The earlier technique of searching only for the global maximum in the cross-correlation function would thus need to be expanded to include searching for and interpreting all local maxima. Each local maximum would be expected to correspond to a particular delay in the circuit, and a knowledge, for instance, about the circuit design and the frequencies present could be used to interpret these maxima and determine with which signal each was associated.

General Implementation

Figure 8:
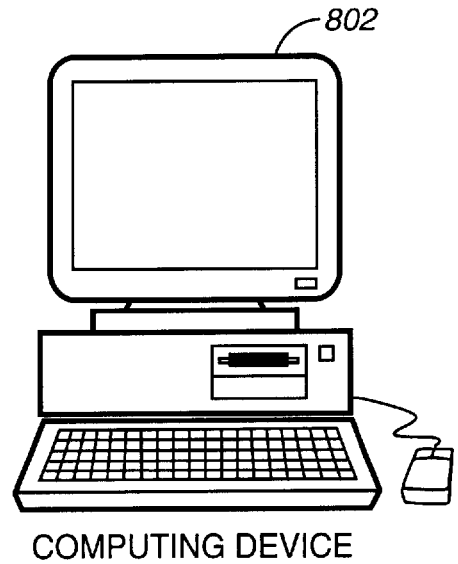
FIG. 8 shows a system for implementing the disclosed methods.

Referring to FIG. 8, there is shown a system 800 for implementing the preferred embodiments described above.

Figure 9:
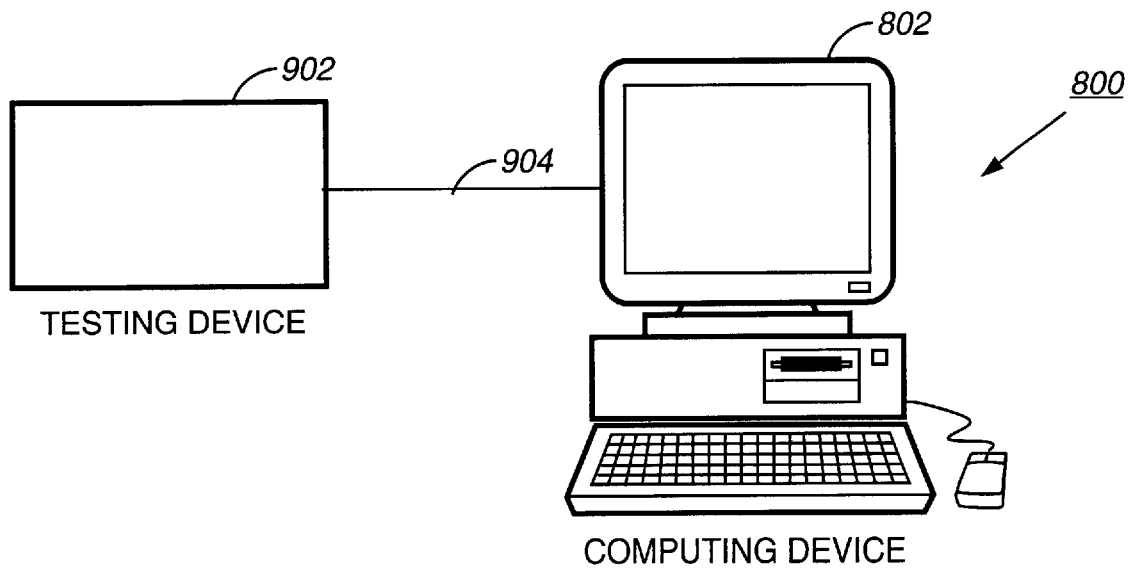
FIG. 9 shows a system for acquiring the data and implementing the disclosed methods.

The computing device 802 is a general purpose computer which can perform the operations required in the disclosed embodiments. The waveform data is presumed to be stored on the computing device 802. FIG. 9 shows a system 900 comprising the computing device 802 attached to a testing device 902 through a connection 904. The testing device 902 is a device capable of accumulating and transmitting the waveform data to the computing device 802. The Base Application describes an embodiment for a testing device. The connection 904 can be any type of communication link, including but not limited to a serial link over a coaxial cable.

The present invention can be implemented by hardware, software, or a combination of both. The functions required can be performed by simple logic elements, advanced digital signal processing ("DSP") chips, microprocessors, EEPROMs containing appropriate instructions, etc. Additionally, firmware routines or software routines, written in machine language, a high level object-oriented language like C++, or many others can implement the embodiments disclosed. Combinations of hardware and software could also be used to build a system that tests the IC, detects the photons, and computes the timing data.

Moreover, at least some of this functionality may be embodied in computer readable media such as 3.5 inch diskettes to be used in programming an information-processing apparatus to perform in accordance with the invention. This functionality may also be embodied in computer readable media such as a transmitted waveform to be used in transmitting the information or functionality.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method for determining picosecond time delay between data taken form a first location and taken from a second location on an integrated circuit ("IC"), using at least a first previously digitized waveform and a second previously digitzied waveform, the method comprising the steps of:

processing a first previously digitized selected wavefonrm from storage by performing a Fourier transform on the first selected waveform, wherein the first selected waveform is comprised of picosecond time-resolved optical emission data including the number of photons recorded at specific coordinate location versus time taken from a first location in an IC, wherein the first selected waveform comprises a substantial portion of a first waveform;

processing a second previously digitized selected waveform from storage by performing a Fourirr transform on the second selected waveform, werein, wherein the second,selected waveform is comprised of picosecond time-resolved optical emission data including the number of photons recorded at a specific coordinate location versus time taken from a second location in the IC, wherein the second selected waveform comprises a substantial portion of a second waveform; and analyzing the results of the two processing steps above to compute a value of time delay by calculating a difference of a phase of the Fourier transform of the first selected wave and a phase of the Fourier transform of the second selected wave for a frequency of interest and converting the difference to a value of time delay.

2. The method of claim 1, wherein:

the step of processing the first selected waveform comprises performing a wavelet transform on the first selected waveform;

the step of processing the second selected waveform comprises performing a wavelet transform on the second selected waveform; and the step of analyzing the results of the two processing steps comprises computing a value of time delay.

3. A method for determining picosecond time delay between data taken from a first location taken from a second location on an integrated circuit ("IC"), using at least a first previously digitized waveform and a second previously digitized waveform, the method comprising the steps of:

processing a first previously digitized selected waveform from storage, herein the first selected waveform is comprising or picosecond time-resolved optical emission data including the number of photons recorded at a specific coordinate location versus time taken from a first location in an IC, wherein the first selected waveform comprises a substantial portion of a first waveform;

processing a second reviously digitized selected waveform from storage, wherein the second selected waveform is comprised of picosecond time-resolved optical emission data including the number of photons recorded at a specific coordinate location versus time taken from a second location in the IC, wherein the second selected waveform consprises a substantial portion of a second waveform;

wherein the steps of processing the first selected waveform and processing the second selected waveform comprise:

performing a cross-correlation function between the first selected waveform and the second selected waveforn; and analyzing the results of the two processing steps above to compute a value of time delay by finding a cross-correlation function.

4. The method of claim 3, wherein the step of filtering comprises using a Fourier filter.

5. The method of claim 1, further comprising the step of processing a third selected waveform, wherein the third selected waveform comprises a substantial portion of a third waveform, and wherein the third waveform comprises time-resolved optical emission data obtained from a third location.

6. The method of claim 5 wherein the steps of processing the first selected waveform, the second selected waveforn, and the third selected waveform comprise:

converting the first selected waveform into its binary equivalent;

converting the third selected waveforn into its binary equivalent;

combining the two binary equivalents through a logical function to produce a binary output;

converting the binary output into its waveform equivalent;

processing a substantial portion of the waveform equivalent;

processing the second selected waveform; and analyzing the results of the two processing steps.

7. The method of claim 1, further comprising the steps of:

generating the first waveform from time-resolved optical emission data for the first location; and generating the second waveform from time-resolved optical emission data for the second location.

8. The method of claim 7, wherein:

the step of generating the first waveform comprises:

determining, for each desired value of time, the number of photon emissions that were recorded in the time-resolved optical emission data for the first location; and assigning that number to the value of the first waveform for the corresponding value of time; and the step of generating the second waveform comprises:

determining, for each desired value of time, the number of photon emissions that were recorded in the time-resolved optical emission data for the second location; and assigning that number to the value of the second waveform for the corresponding value of time.

9. The method of claim 1, further comprising displaying the results of the analysis step.

10. The method of claim 9, wherein the step of analyzing the results comprises determining a time delay between the first location and the second location, and wherein the step of displaying the results of the analysis step comprises displaying the time delay between the first location and the second location.

11. The method of claim 1, further comprising the steps of:

processing a plurality of additional selected waveforms, wherein each of the plurality of additional selected waveforms comprises a substantial portion of one of a plurality of additional waveforms, and wherein each of the plurality of additional waveforms comprises time-resolved optical emission data obtained from one of a plurality of additional locations on the IC; and analyzing the results of the processing of the plurality of additional selected waveforms, along with the results of the processing of the first selected waveform and the second selected waveform.

12. The method of claim 11, further comprising the step of displaying the results from the step of analyzing the results of the processing of the first selected waveform, the second selected waveform, and the plurality of additional selected waveforms.

13. The method of claim 12, wherein:

the results from the step of analyzing the results of the processing of the first selected waveform, the second selected waveform, and the plurality of additional selected waveforms comprise a relative phase delay between the first location and each of the other locations; and the step of displaying the results from the step of analyzing the results of the processing of the first selected waveform, the second selected waveform, and the plurality of additional selected waveforms comprises using a color coded display over the schematic of the IC, wherein different colors represent the different phase delays.

14. The method of claim 12, wherein:

the various processing steps comprise performing cross-correlations between the selected waveforms such that the second selected waveform is cross-correlated with the first selected waveform and with each of the plurality of additional selected waveforms;

a local maximum is determined from each cross-correlation, wherein the local maximum corresponds to a delay time between the second location and the other location involved in each of the cross-correlations; and each of the delay times is displayed on a contour plot.

15. A computer readable medium containing program instructions for determining picosecond time delay between data taken from a first location and taken from a second location on an integrated circuit ("IC"), using at least a first previously digitized waveform and a second previously digitized waveform, the program instructions comprising instructions for:

processing a first previously digitized selected waveform from storage by performing a Fourier transform on the first selected waveform, wherein the first selected waveform is comprised of picosecond time-resolved optical emission data including the number of photons recorded at a specific coordinate location versus from a first location in and IC, wherein the first selected waveform comprises a substantial portion of a first waveform;

processing a second previously digitized selected waveform from storage by performing a Fourier transform on the second selected waveform, wherein the second selected waveforn is comprised of picosecond time-resolved optical emission data including the number of photons recorded at a specific coordinate location versus time taken from a second location in the IC, wherein the second selected waveform comprises a substantial portion of a second waveform; and analyzing the results of the two processing steps above to compute a value of time delay by calculating a difference of a phase of the Fourier transform of the first selected wave and a phase of the Fourier transform of the second selected wave for a frequency of interest and conrarting the difference to a value of time delay.

16. The medium of claim 15, further comprising program instructions for displaying the results of the analysis.

17. A system for determining picosecond time delay between data taken from a first location and taken from a second location on an integrated circuit ("IC"), using at least a first previously digitized waveform and a second previously digitized waveform, the system comprising:

means for processing a first previously digitized selected waveform from storage by performing a Fourier transform on the first selected waveform, wherein the first selected waveform is comprised of picosecond time-resolved optical emission data including the number of photons recorded at a specific coordinate location versus time taken from a first location in an IC, wherein the first selected waveform comprising a substantial portion of a first waveform;

means for processing a second previously digitized selected waveform form storage by proforing a Fourier transform on the second selected waveform wherein the second selected waveform is comprised of picosecond time-resolved optical emission data including the number of photons recorded at a specific coordinate location versus time taken form a second location in the IC, wherein the second selected waveform comprises a substantial portion of a second waveform; and means for analyzing the results of the two processing means above to compute a value of time delay by calculating a difference of phase of the Fourier transform of the first selected wave and a phase of the Fourier transform of the second selected wave for a frequency of interest and converting the difference to a value of time delay.

18. The system of claim 17, further comprising a means for displaying the analysis results from the means for analyzing.

19. The system of claim 17, wherein:

the means for processing the first selected waveform comprises software which can perform cross-correlation functions and Fourier transforms;

the means for processing the second selected waveform comprises software which can perform cross-correlation functions and Fourier transforms; and the means for analyzing the results comprises software which can perform subtraction of the phases for frequencies of interest, as produced by the transforms.

\* \* \* \* \*

UNITED STATES PATENT AND TRADEMARK OFFICE
CERTIFICATE OF CORRECTION

PATENT NO. : 6,327,394 B1
DATED : December 4, 2001
INVENTOR(S) : Jeffrey Kash et al.

It is certified that error appears in the above-identified patent and that said Letters Patent is hereby corrected as shown below:

Column 16,
Line 46, change from "wavefonrn" to -- waveform --
Line 51, change from "at specific" to -- at a specific --
Line 56, change from "Fourirr" to -- Fourier --
Line 57, change from "werein, wherein" to -- wherein --
Line 58, change from "second, selected" to -- second selected --

Column 17,
Line 19, change from "herein" to -- wherein --
Line 20, change from "comprising or" to -- comprised of --
Line 26, change from "reviously" to -- previously --
Line 39, change from "waveforn" to -- waveform --
Line 41, change from "finding a" to -- finding peaks of a --
Line 52, change from "waveforn," to -- waveform, --
Line 56, change from "waveforn" to -- waveform --

Column 19,
Line 19, change from "and" to -- an --
Line 25, change from "waveforn" to -- waveform --
Line 36, change from "conrarting" to -- converting --

UNITED STATES PATENT AND TRADEMARK OFFICE
CERTIFICATE OF CORRECTION

PATENT NO. : 6,327,394 B1
DATED : December 4, 2001
INVENTOR(S) : Jeffrey Kash et al.

It is certified that error appears in the above-identified patent and that said Letters Patent is hereby corrected as shown below:

<u>Column 20,</u>
Line 10, change from "comprising" to -- comprises --
Line 13, change from "form" to -- from --
Line 13, change from "proforing" to -- performing --
Line 18, change from "form" to -- from --
Line 23, change from "of phase" to -- of a phase --

Signed and Sealed this

Nineteenth Day of March, 2002

Attest:

JAMES E. ROGAN
Attesting Officer  *Director of the United States Patent and Trademark Office*